(12) United States Patent
Ma

(10) Patent No.: US 7,947,581 B2
(45) Date of Patent: May 24, 2011

(54) FORMATION OF GRAPHENE WAFERS ON SILICON SUBSTRATES

(75) Inventor: Ce Ma, San Diego, CA (US)

(73) Assignee: Linde Aktiengesellschaft, Munich (DE)

( * ) Notice: Subject to any disclaimer, the term of this patent is extended or adjusted under 35 U.S.C. 154(b) by 0 days.

(21) Appl. No.: 12/538,214

(22) Filed: Aug. 10, 2009

(65) Prior Publication Data
US 2011/0034011 A1   Feb. 10, 2011

(51) Int. Cl.
*H01L 21/20* (2006.01)
*H01L 21/36* (2006.01)
*H01L 21/00* (2006.01)

(52) U.S. Cl. ........ 438/509; 438/478; 438/503; 438/507; 977/734; 977/755; 977/844; 977/847

(58) Field of Classification Search .................. 438/509, 438/478, 503, 507; 257/E21.101; 977/734, 977/755, 844, 847
See application file for complete search history.

(56) References Cited

U.S. PATENT DOCUMENTS

| | | | | |
|---|---|---|---|---|
| 7,811,906 B1 * | 10/2010 | Bol et al. | ...................... | 438/478 |
| 2006/0099750 A1 * | 5/2006 | DeHeer et al. | ................ | 438/194 |
| 2008/0226838 A1 * | 9/2008 | Nishimura et al. | ........... | 427/569 |
| 2008/0251812 A1 * | 10/2008 | Yoo | ............................... | 257/183 |
| 2008/0286910 A1 * | 11/2008 | Yamazaki et al. | ............. | 438/151 |
| 2009/0181502 A1 * | 7/2009 | Parikh et al. | ................... | 438/164 |
| 2009/0294759 A1 * | 12/2009 | Woo et al. | ........................ | 257/29 |
| 2010/0006823 A1 * | 1/2010 | Anderson et al. | ................ | 257/24 |
| 2010/0021708 A1 * | 1/2010 | Kong et al. | .................... | 428/220 |
| 2010/0032409 A1 * | 2/2010 | Hong et al. | ..................... | 216/41 |
| 2010/0055464 A1 * | 3/2010 | Sung | .............................. | 428/408 |
| 2010/0065988 A1 * | 3/2010 | Hannon et al. | ................ | 264/500 |
| 2010/0101710 A1 * | 4/2010 | Choi et al. | ..................... | 156/230 |

OTHER PUBLICATIONS

A.K. Geim and K.S. Novoselov, The Rise of Graphene, Manchester Centre for Mesoscience and Nanotechnology, University of Manchester, 2007, 14 pp., Nature Materials 6, U.K.

* cited by examiner

*Primary Examiner* — Angel Roman
(74) *Attorney, Agent, or Firm* — David A. Hey

(57) ABSTRACT

Processes for forming full graphene wafers on silicon or silicon-on-insulator substrates. The processes comprise formation of a metal carbide layer on the substrate and annealing of the metal carbide layer under high vacuum. For volatile metals, this annealing step results in volatilization of the metal species of the metal carbide layer and reformation of the carbon atoms into the desired graphene wafer. Alternatively, for non-volatile metals, the annealing step results in migration of the metal in the metal carbide layer to the top surface of the layer, thereby forming a metal rich top layer. The desired graphene layer is formed by the carbon atoms left at the interface with the metal rich top layer. The thickness of the graphene layer is controlled by the thickness of the metal carbide layer and by solid phase reactions.

19 Claims, 1 Drawing Sheet

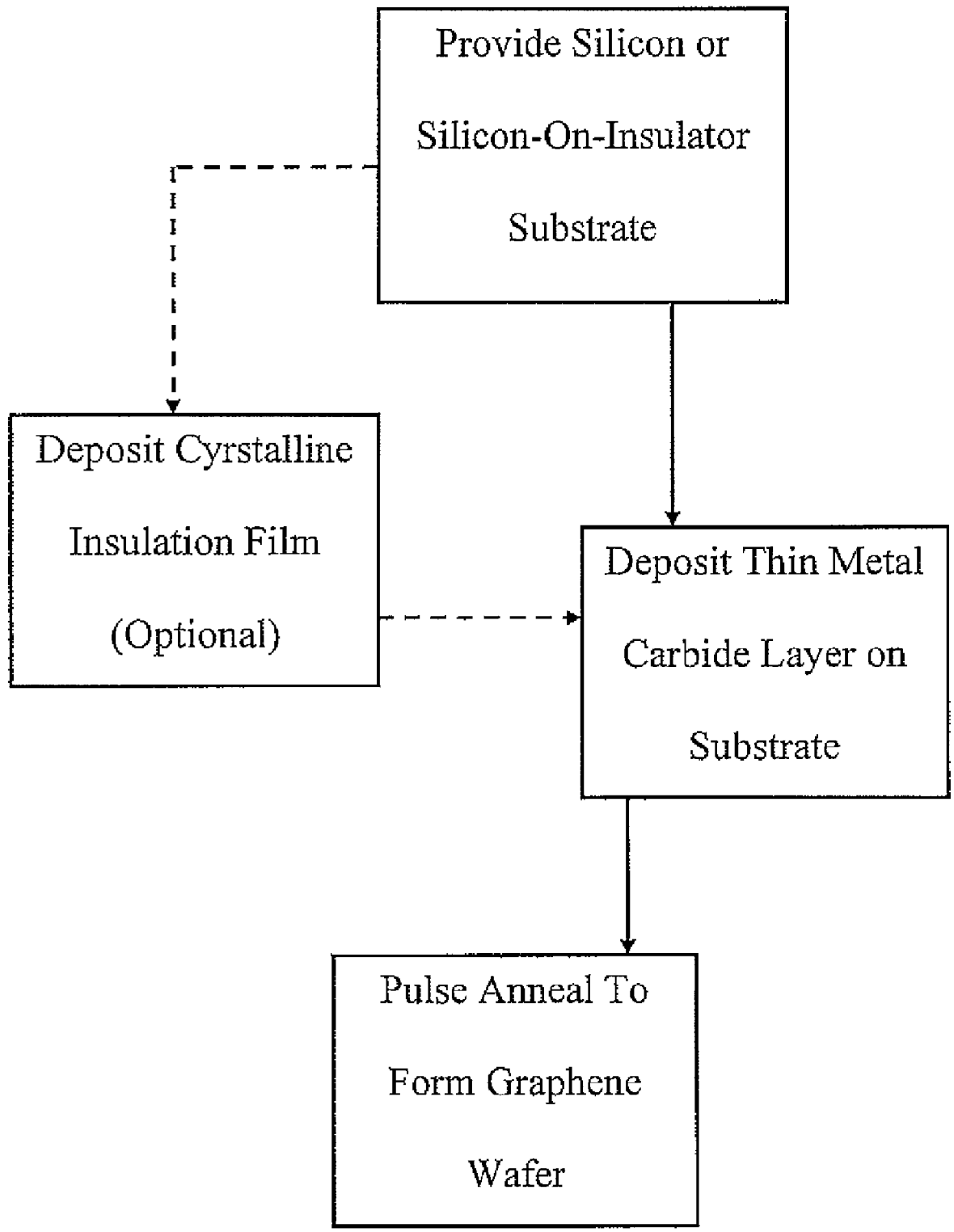

FORMATION OF GRAPHENE WAFERS ON SILICON SUBSTRATES

FIELD OF THE INVENTION

The present invention relates to the use of graphene in semiconductor devices and to methods of growing graphene layers on silicon substrates.

BACKGROUND OF THE INVENTION

Graphene comprises a flat monolayer of carbon atoms tightly packed into a two dimensional honeycomb lattice. Graphene is one of the basic building blocks for graphite materials of other dimensionalities.

Graphene is being studied as a replacement for silicon materials in semiconductor devices as well as other material science and condensed matter physics applications. Because of the two dimensional structure, graphene exhibits very high crystal and electronic qualities that have a great number of potential applications, particularly where layers of one to a few atom thickness are desired.

In the area of semiconductor materials, graphene has shown high charge mobility performance, although such has been accomplished only with small fragments of graphene layers. In order to be of practical usefulness, full graphene wafers that contain one to a few layers of graphene on traditional silicon substrates will be necessary. Current methods of obtaining graphene layers are by exfoliation from sections of graphite crystals or by thermal decomposition of the surface layer of a SiC wafer. In-situ chemical vapor deposition of graphene has been achieved, but only in small fragments on metal surfaces.

Therefore, there is a need in the art for improvements to the formation of graphene layers for use in semiconductor applications.

SUMMARY OF THE INVENTION

The present invention provides methods of creating full graphene wafers on silicon or silicon-on-insulator substrates.

BRIEF DESCRIPTION OF THE DRAWINGS

FIG. 1 is a process flow diagram showing stages in the process according to one embodiment of the present invention.

DETAILED DESCRIPTION OF THE INVENTION

The present invention provides a method of forming full graphene wafers onto a silicon or silicon-on-insulator substrate. The process of the present invention is described below with reference to FIG. 1. In particular, FIG. 1, is a process flow diagram showing the stages of the process of the present invention.

Initially, a substrate is provided. This can be a silicon substrate or a silicon-on-insulator substrate. A preferred substrate is an Si(111) substrate. A crystalline insulator film can optionally be formed onto the substrate. This insulation film can be any suitable insulator material, such as a metal oxide, metal nitride or metal oxynitride. The insulator film may be deposited by any know deposition method, including atomic layer deposition (ALD), chemical vapor deposition (CVD) or molecular beam epitaxial growth (MBE).

The next stage of the process according to the present invention comprises depositing a metal carbide layer onto either the substrate or onto the optional insulation film. The metal carbide can have the formula $M_xC_y$ wherein M is a metal, x is 1 to 4 and y is 1 to 8. Metal carbides such as silicon carbide (SiC), tungsten carbide (WC), molybdenum carbide (MoC), aluminum carbide ($Al_4C_3$), cobalt carbide (CoC), tantalum carbide (TaC), magnesium carbide ($MgC_2$) or sodium carbide ($Na_2C_2$) can be used. Preferably the metal carbide layer is grown in a hexagonal crystalline plane to a thickness of 1 to 10 atomic layers, the thickness being controlled to match the desired thickness of the graphene layer to be formed. Any deposition method including ALD, CVD and MBE methods can be used to form atomic, smooth and uniform metal carbide layers.

The substrate having the metal carbide layer thereon is then subjected to pulse annealing in high vacuum to create the desired graphene wafer. The backside of the substrate is cooled by any applicable means, including the use of heat exchange media, e.g. helium gas. The top surface of the metal carbide layer is exposed to flash or pulse heating such as by lamps or lasers. This heating raises the surface temperature of the metal carbide layer to between 900° C. and 1500° C., resulting in volatilizing the metallic species or movement of the metal species in the metal carbide layer. Examples of metal species that are volatized by this process include Si(g), Na(g), $Na_2$(g), Mg(g), Al(g) and others. In these cases the volatized metal is sublimated to the vacuum and exits the system and the remaining carbon atoms of the metal carbide layer then connect with each other to form the desired graphene layer. Other metal species are not volatile but are mobile at the process temperatures. In these cases, the metal species migrates toward the vacuum medium to create a metal rich top layer, with a graphene layer formed from the carbon atoms at the interface. The top metal rich layer can be advantageously patterned for use as electrodes or gate layers.

The graphene layer created by the above annealing stage will have a thickness corresponding with the original thickness of the metal carbide layer, e.g. from 1 to 10 atoms thick when the metal species in volatile. This graphene layer may then be patterned using standard lithographic processes, such as with the use of a hard oxide mask. For example, graphene exposed through the hard mask may be etched using directional oxygen ions.

The graphene layer crated by the annealing process according to the present invention when the metal species is not volatile, but rather mobile, will have a thickness of one to a few atoms layers. As noted, a metallic rich top layer will also be created that can be removed or advantageously patterned for use as electrodes or gate layers. In addition, the created graphene layer that is exposed through the patterned metallic rich top layer can also be patterned as noted above.

The process of the present invention makes it possible to create full graphene wafers on silicon or silicon-on-insulator substrates. These graphene layers make it possible to utilize the unique electrical properties of graphene for many applications, including use in semiconductor devices.

It will be understood that the embodiments described herein are merely exemplary and that one skilled in the art may make variations and modifications without departing from the spirit and scope of the present invention. All such variations and modifications are intended to be included within the scope of the invention as described above. Further, all embodiments disclosed are not necessarily in the alternative, as various embodiments of the invention may be combined to provide the desired result.

What is claimed is:

1. A method of forming a graphene layer on a substrate, comprising providing the substrate;
depositing a metal carbide layer onto the substrate; and
pulse annealing the metal carbide layer in high vacuum layer to produce the graphene layer, wherein annealing comprises migrating the metallic species of the metal carbide layer toward the vacuum to form a metal rich layer and reforming the carbon atoms of the metal carbide layer into the graphene layer.

2. The method of claim 1 further comprising patterning the metal rich layer.

3. The method of claim 2 wherein patterning comprises exposing the graphene layer to directional oxygen ions through a hard oxide mask.

4. The method of claim 1 wherein the substrate is a silicon substrate or a silicon-on-insulator substrate.

5. The method of claim 4 wherein the substrate is an Si(111) substrate.

6. The method of claim 4 wherein the substrate is a silicon-on-insulator substrate, the insulator comprising a crystalline insulator film.

7. The method of claim 6 wherein the insulator is a metal oxide, a metal nitride or a metal oxynitride.

8. The method of claim 6 wherein the insulator is deposited by atomic layer deposition, chemical vapor deposition or nucl or molecular beam epitaxy.

9. The method of claim 1 wherein the metal carbide layer has the formula

wherein M is a metal, x is 1 to 4 and y is 1 to 8.

10. The method of claim 9 wherein the metal carbide layer is silicon carbide, tungsten carbide, molybdenum carbide, aluminum carbide, cobalt carbide, tantalum carbide, magnesium carbide or sodium carbide.

11. The method of claim 1 wherein the metal carbide layer has a hexagonal crystalline plane with thickness of 1 to 10 atomic layers.

12. The method of claim 1 wherein the metal carbide layer is deposited by atomic layer deposition, chemical vapor deposition or molecular beam epitaxy.

13. The method of claim 1 wherein annealing comprises exposing the surface of the metal carbide layer to flash or pulse heating by lamps or lasers and cooling the backside of the substrate.

14. The method of claim 13 wherein the cooling comprises cooling by heat exchange media.

15. The method of claim 14 wherein the heat exchange media is helium gas.

16. The method of claim 1 wherein annealing raises the surface temperature of the metal carbide layer to between 900° C. and 1500° C.

17. The method of claim 1 wherein annealing comprises volatilizing the metallic species of the metal carbide layer, sublimating the volatilized metal species to the vacuum and reforming the carbon atoms of the metal carbide layer into the graphene layer.

18. The method of claim 17 wherein the metallic species is Si(g), Na(g), $Na_2$(g), Mg(g), or Al(g).

19. The method of claim 17 wherein the graphene layer has a thickness of 1 to 10 atoms.

* * * * *